(12) United States Patent
Matsumoto et al.

(10) Patent No.: US 9,229,040 B2
(45) Date of Patent: Jan. 5, 2016

(54) DISCONNECTION DETECTION CIRCUIT FOR BRIDGE CIRCUIT AND SYSTEM INCLUDING DISCONNECTION DETECTING MEANS

(75) Inventors: Masahiro Matsumoto, Hitachi (JP); Hiroshi Nakano, Naka-gun (JP); Keiji Hanzawa, Mito (JP); Masamichi Yamada, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 436 days.

(21) Appl. No.: 13/806,827

(22) PCT Filed: Jun. 21, 2011

(86) PCT No.: PCT/JP2011/064137
§ 371 (c)(1),
(2), (4) Date: Dec. 24, 2012

(87) PCT Pub. No.: WO2011/162240
PCT Pub. Date: Dec. 29, 2011

(65) Prior Publication Data
US 2013/0093432 A1    Apr. 18, 2013

(30) Foreign Application Priority Data
Jun. 25, 2010 (JP) ................................. 2010-144413

(51) Int. Cl.
*G01R 31/02* (2006.01)
*G01D 3/08* (2006.01)
*G01R 31/28* (2006.01)

(52) U.S. Cl.
CPC *G01R 31/02* (2013.01); *G01D 3/08* (2013.01); *G01R 31/2829* (2013.01); *G01R 31/026* (2013.01)

(58) Field of Classification Search
CPC .. G01R 31/2829; G01R 31/02; G01R 31/026; G01R 17/00; G01R 31/024; G01R 17/10; G01K 7/20

USPC .......................... 324/324–526, 537, 549, 648
See application file for complete search history.

(56) References Cited

U.S. PATENT DOCUMENTS 5,279,164 A *  1/1994  Araki et al. ..................... 73/708
5,841,308 A    11/1998  Nagata
(Continued)

FOREIGN PATENT DOCUMENTS

JP    4-109371 U    9/1992
JP    6-249730 A    9/1994
(Continued)

OTHER PUBLICATIONS

Japanese-language Office Action dated Jun. 18, 2013 (six (6) pages).
(Continued)

*Primary Examiner* — Vinh Nguyen
*Assistant Examiner* — Dustin Dickinson
(74) *Attorney, Agent, or Firm* — Crowell & Moring LLP

(57) ABSTRACT

In an existing disconnection detection circuit for a bridge circuit, consideration is not taken into the fact that an offset voltage or temperature characteristic of a bridge output is degraded. Provided is a disconnection detection circuit for a bridge circuit capable of suppressing a change in a characteristic of a sensor to a minimal extent. A disconnection detection circuit 8a for a bridge circuit in accordance with the present invention comprises conducting means 9 and 10 each of which causes a current to flow from an output terminal of the bridge circuit to a predetermined potential, potential difference detecting means 12 and 13 each of which detects a potential difference between the potential at the output terminal of the bridge circuit and the predetermined potential, and a disconnection detecting means 14 that detects a disconnection on the basis of the outputs of the potential difference detecting means.

15 Claims, 8 Drawing Sheets

(56) References Cited

U.S. PATENT DOCUMENTS

| | | | |
|---|---|---|---|
| 6,422,088 B1 * | 7/2002 | Oba et al. | 73/754 |
| 6,539,322 B1 * | 3/2003 | Matsumoto et al. | 702/104 |
| 6,949,977 B2 * | 9/2005 | Macciocchi | 330/207 P |
| 2003/0164711 A1 * | 9/2003 | Ishida | 324/610 |
| 2007/0115005 A1 * | 5/2007 | Shimizu et al. | 324/549 |
| 2009/0261861 A1 | 10/2009 | Shimada | |

FOREIGN PATENT DOCUMENTS

| | | |
|---|---|---|
| JP | 7-28502 A | 1/1995 |
| JP | 9-312525 A | 12/1997 |
| JP | 2004-93171 A | 3/2004 |
| JP | 2004-226289 A | 8/2004 |
| JP | 2005-156193 A | 6/2005 |
| JP | 2007-121052 A | 5/2007 |
| JP | 2008-245473 A | 10/2008 |
| JP | 2009-150655 A | 7/2009 |
| JP | 2009-276212 A | 11/2009 |
| JP | 2010-85190 A | 4/2010 |
| JP | 2010-236992 A | 10/2010 |

OTHER PUBLICATIONS

International Search Report dated Sep. 27, 2011 including English-language translation (Seven (7) pages).

* cited by examiner

DISCONNECTION DETECTION CIRCUIT FOR BRIDGE CIRCUIT AND SYSTEM INCLUDING DISCONNECTION DETECTING MEANS

TECHNICAL FIELD

The present invention relates to a disconnection detection circuit for a bridge circuit, or more particularly, to a disconnection detection circuit for a bridge circuit that little affects an output voltage of a bridge circuit.

BACKGROUND ART

Existing examples of a disconnection detection circuit for a bridge circuit include a sensor bridge circuit described in Japanese Unexamined Patent Application Publication No. Hei6-249730.

CITATION LIST

Patent Literature

Patent literature 1: Japanese Unexamined Patent Application Publication No. Hei6-249730

SUMMARY OF INVENTION

Technical Problem

An existing technology described in Japanese Unexamined Patent Application Publication No. Hei6-249730 is such that: as shown in FIG. 2, resistors 19 and 20 are connected to outputs of a bridge circuit composed of sensor element resistors 15, 16, 17, and 18, and to a power supply and a ground respectively; when the output of the bridge circuit is disconnected, an output voltage of the bridge circuit is largely varied; and a sensor output obtained by amplifying the output voltage of the bridge circuit using an amplifier 21 is largely varied so that the fact that the bridge circuit has been disconnected can be detected.

However, in the foregoing disconnection detection circuit, consideration is not taken into the fact that since the resistors 19 and 20 are asymmetrically connected in parallel with the sensor bridge, an offset voltage or temperature characteristic of the sensor is degraded.

The present invention addresses the foregoing situation. An object of the present invention is to provide a disconnection detection circuit for a bridge circuit which suppresses a change in a characteristic of a sensor to a minimalextent.

Solution to Problem

In order to solve the aforesaid problem, a current is caused to flow from an output terminal of a bridge circuit to a predetermined potential, a potential difference between the potential at the output terminal of the bridge circuit and the predetermined potential is detected, and a disconnection is detected based on the potential difference.

Advantageous Effects of Invention

According to the present invention, an adverse effect which a disconnection detection circuit imposes on an output voltage of a sensor bridge circuit can be reduced. Therefore, an offset voltage or temperature characteristic of a sensor bridge output can be improved, and the disconnection of the sensor bridge can be highly precisely detected. Eventually, a highly precise and highly reliable sensor can be provided.

DESCRIPTION OF EMBODIMENTS

Now, referring to FIG. 1 to FIG. 13, embodiments of the present invention will be described below.

Figure 1:
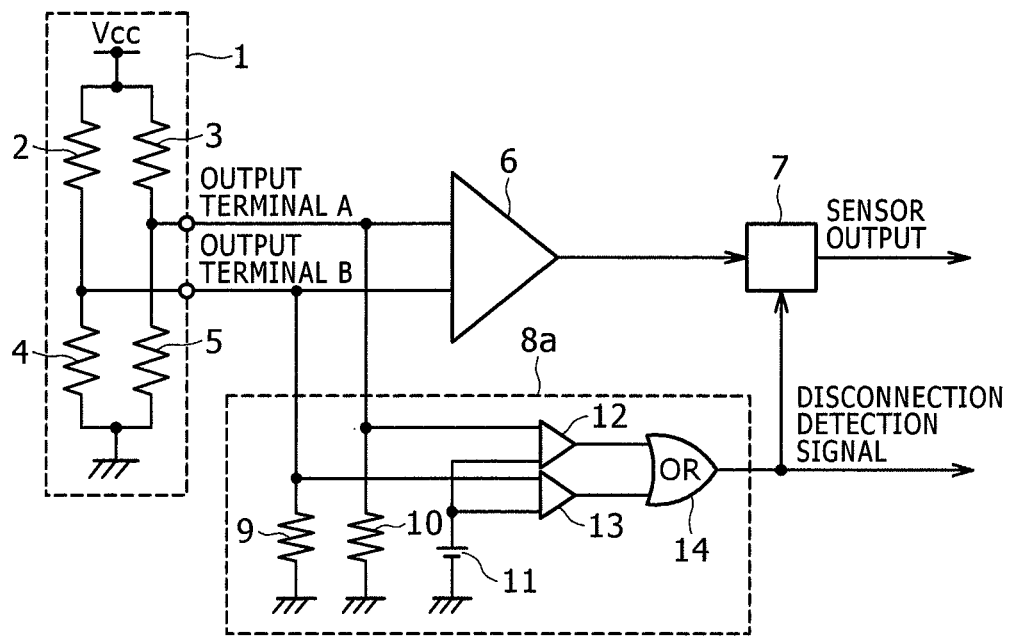
FIG. 1 is a circuit diagram of a disconnection detection circuit for a bridge circuit of a first embodiment.
Figure 2:
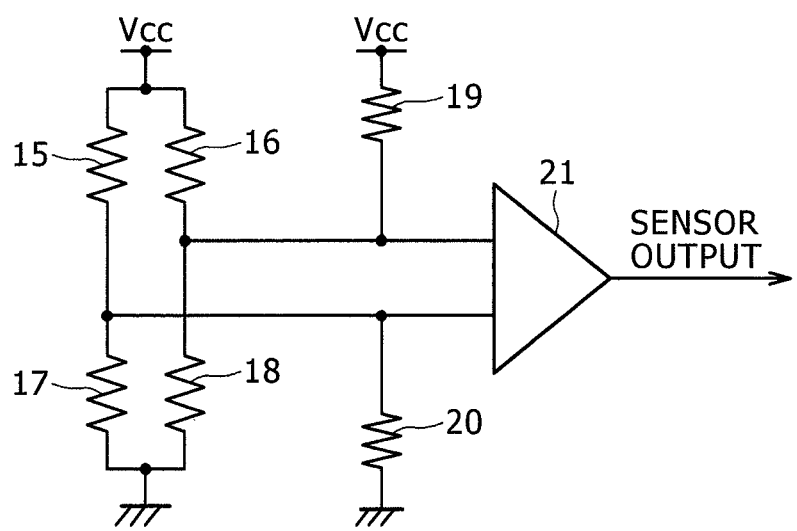
FIG. 2 is a diagram showing a disconnection detection circuit for a bridge circuit of an existing technology.

To begin with, a disconnection detection circuit for a bridge circuit that is a first embodiment of the present invention will be described in conjunction with FIG. 1. FIG. 1 is a circuit diagram of the disconnection detection circuit for a bridge circuit of the first embodiment.

A detection element 1 is formed with a bridge circuit having a series circuit composed of sensor element resistors 2 and 4 and series resistors, which include sensor element resistors 3 and 5, connected in parallel with each other. When the resistance values of the sensor element resistors 2, 3, 4, and 5 vary depending on a measurement physical quantity, an intermediate voltage between the sensor element resistors 2 and 4 and an intermediate voltage between the sensor element resistors 3 and 5 vary. Incidentally, the intermediate voltage between the sensor element resistors 3 and 5 is inputted to an output terminal A, and fetched into outside of the detection element 1 through the output terminal A. The intermediate voltage between the sensor element resistors 2 and 4 is inputted to an output terminal B, and fetched into outside of the detection element 1 through the output terminal B. An output voltage (a voltage between the output terminals A and B) of the bridge circuit fetched through the output terminal A and output terminal B is amplified by an amplifier 6, and outputted to outside as a sensor output via a switching circuit 7. For the sensor element resistors, for example, platinum (Pt), tantalum (Ta), molybdenum (Mo), or silicon (Si) is selected.

A disconnection detection circuit 8a includes a resistor 10 that causes a current to flow into the output terminal A, a resistor 9 that causes a current to flow into the output terminal B, a reference voltage source 11 that regenerates a reference voltage, a comparator 12 that compares the voltage at the output terminal A with the voltage at the reference voltage source 11 so as to detect the disconnection of the output terminal A, a comparator 13 that compares the voltage at the output terminal B with the voltage at the reference voltage source 11 so as to detect the disconnection of the output terminal B, and an OR circuit 14 that obtains an OR of the comparator 12 and comparator 13. If the disconnection detection circuit 8a detects a disconnection, the switching circuit 7 fixes the sensor output to a ground voltage or a supply voltage.

Next, actions of the disconnection detection circuit 8a will be described. The disconnection detection circuit 8a detects the disconnections of the output terminal A and output terminal B.

If the output terminal A is disconnected, the potential at the output terminal A is brought to a ground potential by the resistor 10. The potential at the output terminal A is compared with the voltage at the reference voltage source 11 by the comparator 12. When the output terminal A is disconnected, the disconnection is reflected on the output of the comparator 12.

If the output terminal B is disconnected, the potential at the output terminal B is brought to the ground potential by the resistor 9. The potential at the output terminal B is compared with the voltage at the reference voltage source 11 by the comparator 13. When the output terminal B is disconnected, the disconnection is reflected on the output of the comparator 13.

Therefore, if the output terminal A or output terminal B is disconnected, the disconnection is reflected on the output of the OR circuit that obtains the OR of the outputs of the comparators 12 and 13. Owing to the constitution, the disconnection detection circuit 8 can detect the disconnections of the output terminal A and output terminal B.

Next, the features of the disconnection detection circuit 8a of the present embodiment will be described below. The disconnection detection circuit 8a is a circuit that is symmetrical with respect to the output terminals A and B of the bridge circuit of the detection element 1, whereby an adverse effect on an output voltage of the bridge circuit of the detection element 1 can be minimized. Specifically, a circuit to be connected to the output terminal A includes the resistor 10 and comparator 12, and a circuit to be connected to the output terminal B includes the resistor 9 and comparator 13. Thus, since the identical circuits are connected to the respective output terminals, adverse effects which the disconnection detection circuit 8a imposes on the output terminal A and output terminal B respectively are identical to each other. Accordingly, an adverse effect on the output voltage of the bridge circuit of the detection element 1 (a difference voltage between the output terminal A and output terminal B) can be reduced.

Figure 3:
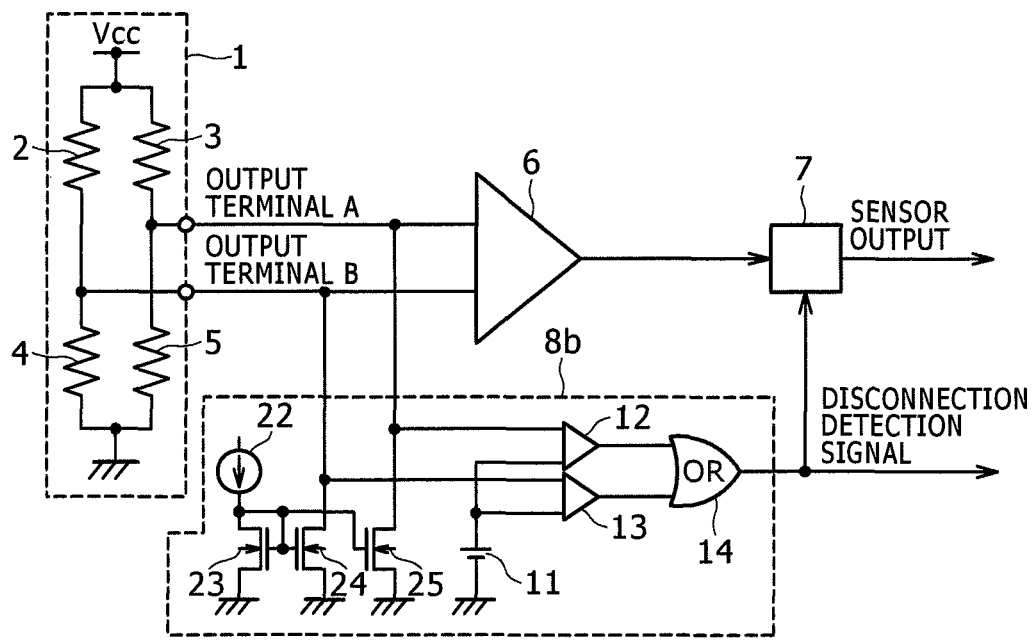
FIG. 3 is a circuit diagram of a disconnection detection circuit for a bridge circuit of a second embodiment.
Figure 4:
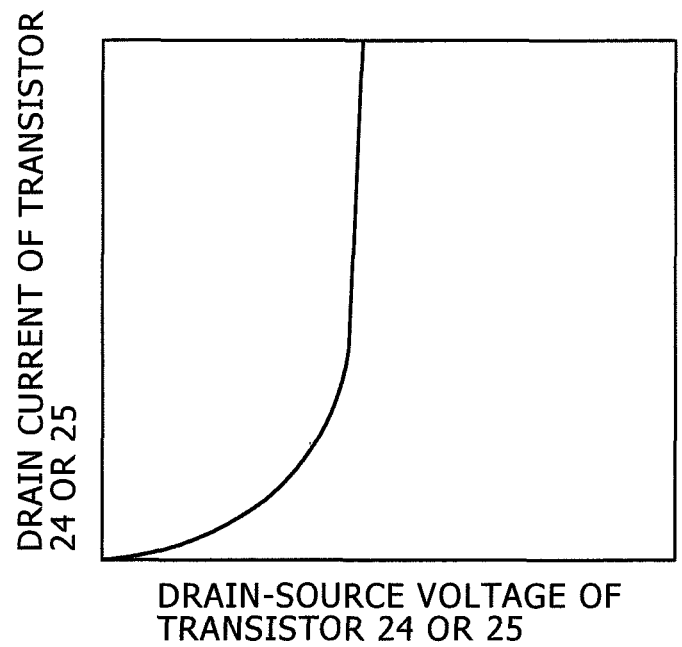
FIG. 4 is a diagram showing a drain current characteristic of transistors 24 and 25.

Next, a disconnection detection circuit for a bridge circuit that is a second embodiment of the present invention will be described in conjunction with FIG. 3 and FIG. 4. Incidentally, FIG. 3 is a circuit diagram of the disconnection detection circuit for a bridge circuit of the second embodiment, and FIG. 4 is a diagram showing a drain current characteristic of transistors 24 and 25. The disconnection detection circuit for a bridge circuit of the second embodiment is such that the resistors 9 and 10 of the disconnection detection circuit for a bridge circuit of the first embodiment are changed into a current mirror circuit composed of transistors 23, 24, and 25.

In the disconnection detection circuit 8b for a bridge circuit of the present embodiment, the resistors 9 and 10 are changed into a current mirror circuit composed of the transistors 23, 24, and 25. A constant current source 22 is connected to the transistor 23, so that the drain currents of the transistors 24 and 25 exhibit a characteristic shown in FIG. 4. Accordingly, when the output terminals A and B are not disconnected, the impedances of the transistors 24 and 25 with respect to the output terminals A and B can be raised. Therefore, an adverse effect on the output voltage of the bridge circuit can be further reduced.

When the disconnection of the output terminal A or output terminal B is detected, the impedance of the transistor 24 or 25 with respect to the output terminal A or B can be diminished. Therefore, since the voltage at the disconnected output terminal A or B can be dropped, a margin of a threshold for the comparator 12 or 13 can be increased. Eventually, precision in disconnection detection can be improved.

Figure 5:
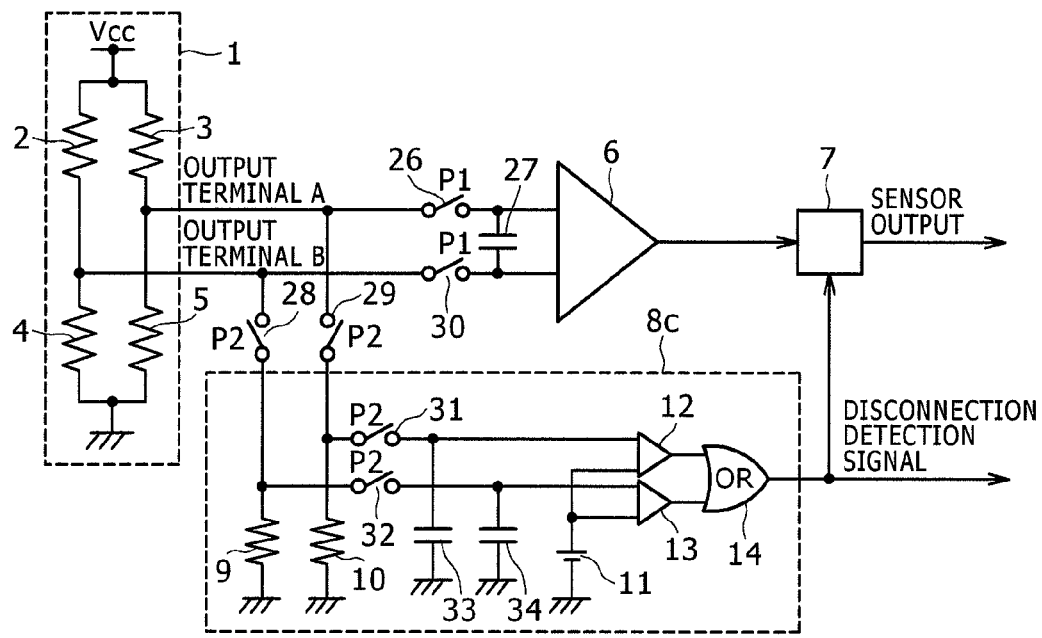
FIG. 5 is a circuit diagram of a disconnection detection circuit for a bridge circuit of a third embodiment.
Figure 6:
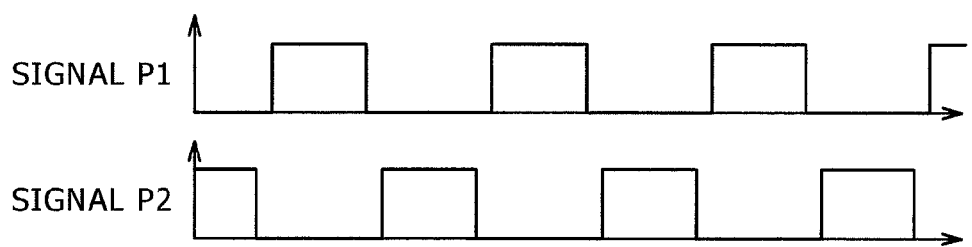
FIG. 6 is a timing chart of control signals for switches 26, 28, 29, 30, 31, and 32.

Next, a disconnection detection circuit for a bridge circuit of a third embodiment of the present invention will be described in conjunction with FIG. 5 and FIG. 6. FIG. 5 is a circuit diagram of the disconnection detection circuit for a bridge circuit of the third embodiment, and FIG. 6 is a timing chart of control signals for switches 26, 28, 29, 30, 31, and 32. The third embodiment is such that the switches 26, 28, 29, 30, 31, and 32 and capacitors 27, 33, and 34 are added to the first embodiment.

In the present embodiment, the switches 26, 28, 29, 30, 31, and 32 and capacitors 27, 33, and 34 are added so that detection of a bridge voltage and disconnection detection can be executed in time-sharing manner. Specifically, at timing P1, the switches 26 and 30 are made in order to connect the output terminals A and B to the amplifier 6, whereby the output voltage of the bridge circuit is detected. At this time, the switches 28 and 29 enter a broken state. Therefore, the disconnection detection circuit 8c does not affect the output voltage of the bridge circuit because the bridge circuit is completely disconnected from the disconnection detection circuit 8c. The capacitor 27 is included to hold the voltage at the timing P1 in preparation for the timing P2 when the switches 26 and 30 are broken.

Thereafter, the switches 28, 29, 31, and 32 are made at the timing P2 in order to connect the output terminals A and B to the disconnection detection circuit 8c, whereby the disconnection of the output terminal A or B of the bridge circuit is detected. At this time, the switches 26 and 30 are left broken and completely disconnected from the amplifier 6. Therefore, an input resistance of the amplifier 6 does not affect the disconnection detection circuit 8. The capacitors 33 and 34 are included to hold the voltages attained at the timing P2 in preparation for the timing P1 when the switches 28, 29, 31, and 32 are broken.

Figure 7:
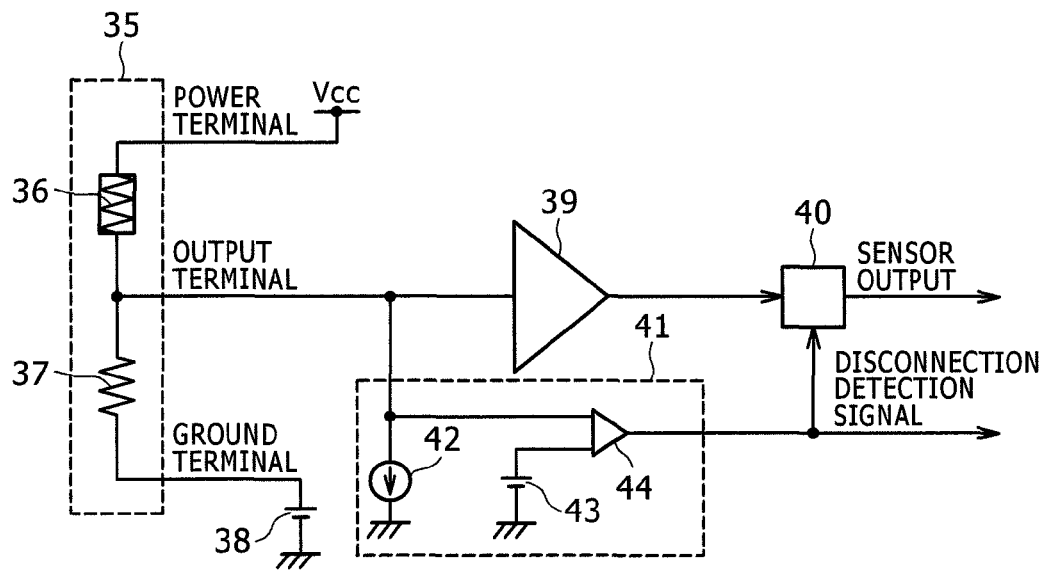
FIG. 7 is a circuit diagram of a disconnection detection circuit for a bridge circuit of a fourth embodiment.

Next, a disconnection detection circuit for a bridge circuit that is a fourth embodiment of the present invention will be described in conjunction with FIG. 7. FIG. 7 is a circuit diagram of the disconnection detection circuit for a bridge circuit of the fourth embodiment.

To begin with, a detection element 35 is a half bridge circuit composed of sensor element resistors 36 and 37. When the sensor element resistors 36 and 37 vary depending on a measurement physical quantity, a voltage at an output terminal of the bridge circuit is varied. An output voltage of the half bridge circuit is amplified by an amplifier 39 and outputted to outside as a sensor output. A supply voltage Vcc is connected to a power terminal of the bridge circuit, and a predetermined voltage is fed to a ground terminal via a reference voltage source 38. A disconnection detection circuit 41 includes a constant current source 42 that feeds a current to the output terminal of the half bridge circuit, a reference voltage source 43 that generates a reference voltage, and a comparator 44 that compares a voltage at the output terminal of the half bridge circuit with the value of the reference voltage source 43 so as to detect the disconnection of the output terminal. If the disconnection detection circuit 41 detects a disconnection, a switching circuit 40 fixes the sensor output to a ground voltage or supply voltage.

Next, actions of the disconnection detection circuit will be described below. The disconnection detection circuit detects the disconnection of the output terminal of the half bridge circuit. To begin with, if the output terminal is disconnected, the potential at the output terminal is brought to a ground potential by the constant current source 42. The potential at the output terminal is compared with the voltage of the reference voltage source 43 by the comparator 44. Therefore, if the output terminal is disconnected, the disconnection is reflected on the output of the comparator 44. Thus, the disconnection detection circuit 41 detects the disconnection of the output terminal.

Next, the features of the disconnection detection circuit will be described below. Assuming that the sensor element resistor 36 is a component whose resistance varies, like a thermistor, by several digits depending on temperature, the voltage at the output terminal changes from near the voltage at the power terminal of the detection element 35 to near the voltage at the ground terminal.

Assuming that the voltage at the ground voltage is 0 V, when the disconnection of the output terminal has to be reliably detected, it is necessary to increase the current of the constant current source 42 and to set the voltage of the reference voltage source 43 to almost 0 V. This is because, since the output of the detection element 35 at a normal time changes from near the voltage at the power terminal of the detection element 35 to near the voltage at the ground terminal, it is necessary to bring the voltage at a disconnection time to a voltage that falls outside the output at the normal time, and to bring the voltage of the reference voltage source 43, which is a voltage to be compared by the comparator 44, to the voltage that falls outside the output at the normal time. Therefore, in order to reliably bring the voltage at the disconnection time to the voltage that falls outside the output at the normal time, that is, in order to bring the voltage to almost 0 V, it is necessary to increase the current of the constant current source 42 and to bring a comparison voltage of the comparator 44 to near almost 0 V. However, when the current of the constant current source 42 is increased, an adverse effect on a sensor output is intensified. When the voltage of the reference voltage source is brought to almost 0 V, a margin of a threshold for the comparator 44 nearly runs out. Eventually, precision in disconnection detection is degraded.

In the present embodiment, as a voltage at a ground terminal of the detection element 35, a voltage of several volts is applied using the reference voltage source 38. In this case, even if the sensor element resistor 36 is a component whose resistance varies, like a thermistor, by several digits depending on temperature, the voltage at the output terminal changes merely from a voltage at a power terminal of the detection element 35 to the voltage of the reference voltage source 38 that is the voltage at the ground terminal. Therefore, the current of the constant current source 42 can be diminished because it should merely be equal to or lower than the voltage of the reference voltage source 38 at the disconnection time of the output terminal of the detection element 35. In addition, since the voltage of the reference voltage source 43 that is a reference value for disconnection detection can be set to the voltage of the reference voltage source 38, the margin of the threshold for the comparator 44 can be increased. Eventually, precision in disconnection detection can be improved.

Figure 8:
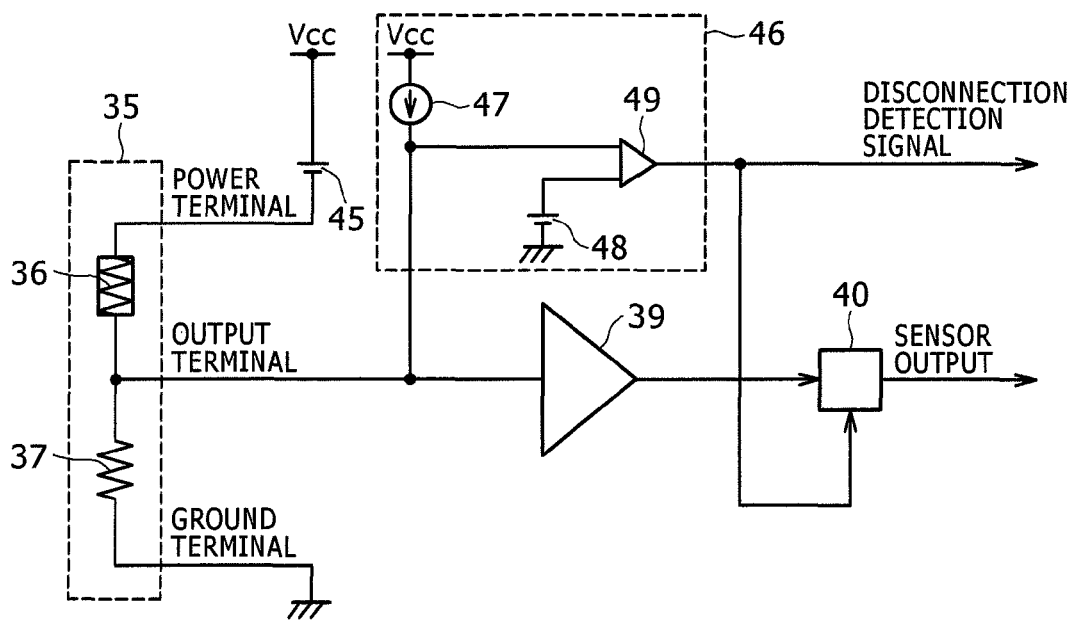
FIG. 8 is a circuit diagram of a disconnection detection circuit for a bridge circuit of a fifth embodiment.

Next, a disconnection detection circuit for a bridge circuit which is a fifth embodiment of the present invention will be described in conjunction with FIG. 8. FIG. 8 is a circuit diagram of the disconnection detection circuit for a bridge circuit of the fifth embodiment. Incidentally, the disconnection detection circuit for a bridge circuit of the fifth embodiment is, contrary to the disconnection detection circuit for a bridge circuit of the fourth embodiment, such that a voltage at a power terminal of a detection element 35 is dropped by several volts using a reference voltage source 45.

To begin with, the detection element 35 is a half bridge circuit composed of sensor element resistors 36 and 37. The sensor element resistors 36 and 37 vary depending on a measurement physical quantity, whereby a voltage at an output terminal of the bridge circuit is varied. The output voltage of the bridge circuit is amplified by an amplifier 39 and outputted to outside as a sensor output. A power terminal of the bridge circuit is connected to a supply voltage Vcc via a reference voltage source 45. A voltage that is lower than the supply voltage Vcc by the voltage of the reference voltage source 45 is fed to the power terminal. A ground terminal is provided with a ground potential. A disconnection detection circuit 46 includes a constant current source 47 that feeds a current into the output terminal, a reference voltage source 48 that generates a reference voltage, and a comparator 49 that compares the voltage at the output terminal with the value of the reference voltage source 48 so as to detect the disconnection of the output terminal. If the disconnection detection circuit 46 detects a disconnection, a switching circuit 40 fixes the sensor output to a ground voltage or supply voltage.

Next, actions of the disconnection detection circuit will be described below. The disconnection detection circuit detects the disconnection of the output terminal. If the output terminal is disconnected, the potential at the output terminal is brought to the supply voltage by the constant current source 47. The potential at the output terminal is compared with the voltage of the reference voltage source 48 by the comparator 49. Therefore, if the output terminal is disconnected, the disconnection is reflected on the output of the comparator 49. Accordingly, the disconnection detection circuit 46 detects the disconnection of the output terminal.

Next, the features of the disconnection detection circuit will be described below. When the sensor element resistor 36 is, like a thermistor, a component whose resistance value varies by several digits depending on temperature, the voltage at the output terminal changes from the voltage at the power terminal of the detection element 35 to the voltage at the ground terminal. Assume that the voltage at the power terminal is equal to the supply voltage Vcc. In this case, for reliably detecting the disconnection of the output terminal, it is necessary to increase the current of the constant current source 47 and to set the voltage of the reference voltage source 48 to almost the supply voltage Vcc. However, when the current of the constant current source 47 is increased, an adverse effect on the sensor output is intensified. When the voltage of the reference voltage source 48 is set to almost the supply voltage Vcc, a margin of a threshold for the comparator 49 nearly runs out. Therefore, precision in disconnection detection is degraded.

In the present embodiment, the reference voltage source 45 is used to drop the voltage at the power terminal of the detection element 35 so that the voltage becomes lower than the supply voltage Vcc by several volts. In this case, even if the sensor element resistor 36 is, like a thermistor, a component whose resistance value varies by several digits depending on temperature, the voltage at the output terminal merely changes from a voltage, which is lower by several volts than the supply voltage that is equal to the voltage at the power terminal of the detection element 35, to the ground voltage.

Therefore, the current of the constant current source 47 can be diminished because when the output terminal of the detection element 35 is disconnected, the voltage at the power supply should merely approach the supply voltage with a margin equivalent to the voltage of the reference voltage source 45. In addition, the voltage of the reference voltage source 48 that is a reference value for disconnection detection can be set with a margin equivalent to the voltage of the reference voltage source 45. Therefore, the margin of the threshold for the comparator 49 can be increased. Eventually, precision in disconnection detection can be improved.

Figure 9:
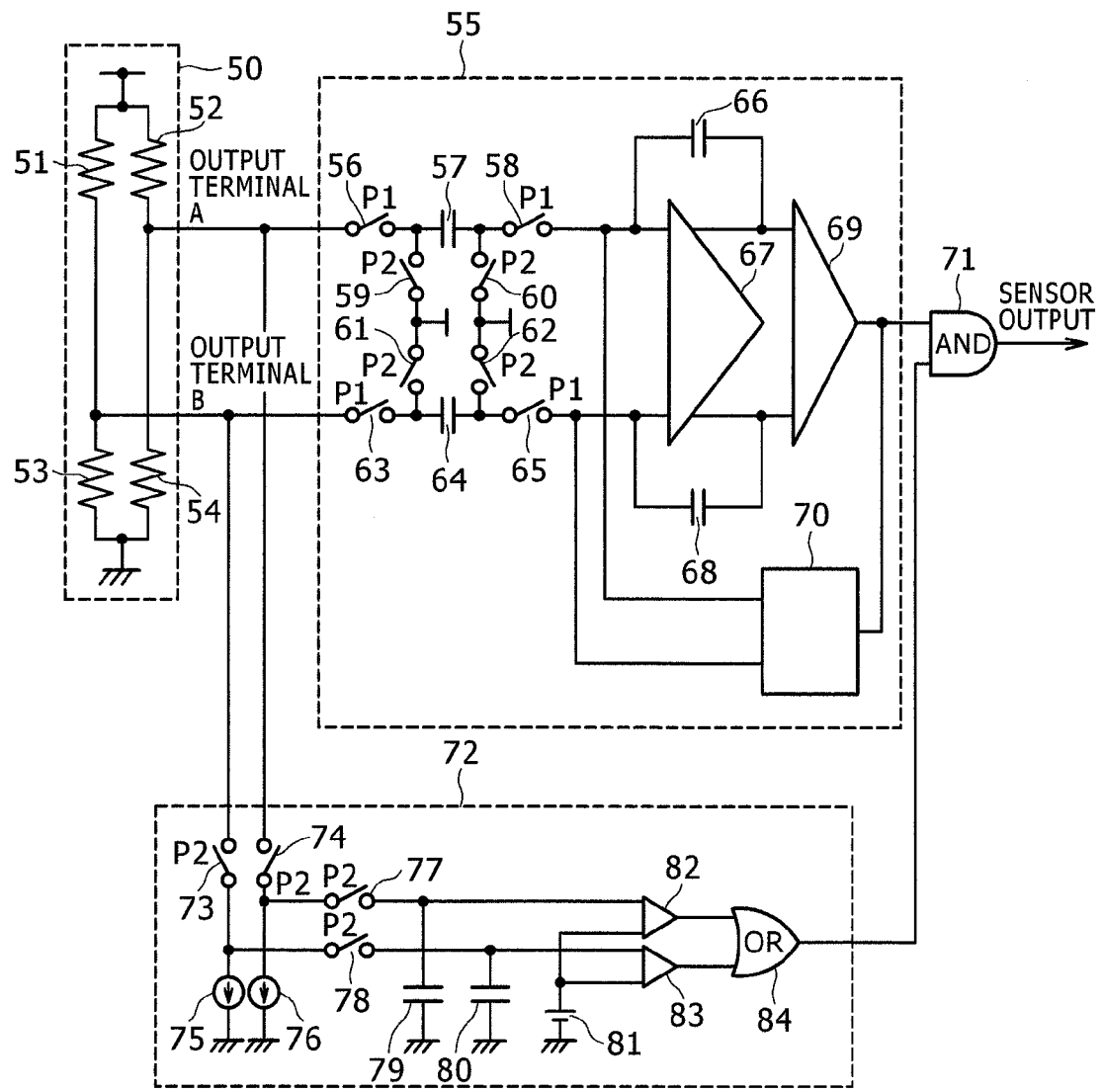
FIG. 9 is a circuit diagram of a disconnection detection circuit for a bridge circuit of a sixth embodiment.

Next, a disconnection detection circuit for a bridge circuit that is a sixth embodiment of the present invention will be described below in conjunction with FIG. 9. FIG. 9 is a circuit diagram of the disconnection detection circuit for a bridge circuit of the sixth embodiment.

To begin with, a detection element 50 is a bridge circuit composed of sensor element resistors 51, 52, 53, and 54. The sensor element resistors 51, 52, 53, and 54 vary depending on a measurement physical quantity, whereby voltages at output terminals A and B of the bridge circuit are varied. An output voltage of the bridge circuit (a voltage between the output terminals A and B) is analog-to-digital converted by a delta-sigma modulator 55 (hereinafter, a ΔΣ modulator), and outputted to outside as a sensor output. Incidentally, the ΔΣ modulator 55 includes an SC integrator that is composed of switches 56, 58, 63, and 65 which act at the timing P1 shown in FIG. 6, switches 59, 60, 61, and 62 which act at the timing P2 shown in FIG. 6, capacitors 57, 64, 66, and 68, and an amplifier 67, a comparator 69 that compares the output of the SC integrator, a local digital-to-analog (D/A) converter 70 that outputs a voltage according to the output of the comparator 69. A disconnection detection circuit 72 includes a switch 74 that acts at the timing P2 shown in FIG. 6 so as to link the output terminal A and a constant current source 76, a switch 73 that acts at the timing P2 shown in FIG. 6 so as to link the output terminal B and a constant current source 75, the constant current source 76 that feeds a current into the output terminal A, the constant current source 75 that feeds a current into the output terminal B, a sample-and-hold circuit that samples voltages across the constant current sources 75 and 76 at the timing P2 shown in FIG. 6 and is composed of switches 77 and 78 and capacitors 79 and 80, a reference voltage source 81 that generates a reference voltage, a comparator 82 that compares a voltage across the capacitor 79 with the value of the reference voltage source 82 so as to detect the disconnection of the output terminal A, a comparator 83 that compares a voltage across the capacitor 80 with the value of the reference voltage source 81 so as to detect the disconnection of the output terminal B, and an OR circuit 84 that obtains an OR of the comparator 82 and comparator 83. In addition, there is an AND circuit 71 that, if the disconnection detection circuit 72 detects a disconnection, fixes the output of the ΔΣ modulator 55 to a ground.

Next, actions of the present embodiment will be described below. The ΔΣ modulator 55 discharges the capacitors 57 and 64 at the timing P2. At the timing P1, the ΔΣ modulator 55 samples the output voltage of the bridge circuit and charges the capacitors using the SC integrator. The disconnection detection circuit 72 acts at the timing P2, which is a non-sampling period of the ΔΣ modulator 55, so as not to affect the action of the ΔΣ modulator 55. The disconnection detection circuit 72 turns on the switches 73, 74, 77, and 78 at the timing P2 so that a constant current flows into the output terminals A and B of the bridge circuit. At this time, if the output terminal A or output terminal B is disconnected, the voltage across the associated constant current source 75 or 76 is dropped to almost a ground potential. The voltage is held by the sample-and-hold circuit including the switches 77 and 78 and capacitors 79 and 80, and compared by the comparator 82 or 83, whereby the disconnection of the output terminal A or B is detected.

Next, the features of the present embodiment will be described below. Since the disconnection detection circuit 72 is a circuit symmetrical with respect to the output terminals A and B of the bridge circuit of the detection element 50, an adverse effect on the output voltage of the bridge circuit of the detection element 50 can be minimized.

Since the disconnection detection circuit 72 acts during the non-sampling period of the ΔΣ modulator 55, the action of the disconnection detection circuit 72 does not affect the ΔΣ modulator 55. In reverse, the action of the ΔΣ modulator 55 does not affect the disconnection detection circuit 72.

When the ΔΣ modulator 55 is employed in a detection circuit for an output voltage of a bridge circuit, it is very easy to fix an output signal to a value that cannot be outputted as an ordinary sensor output because an AND circuit alone is needed.

Figure 10:
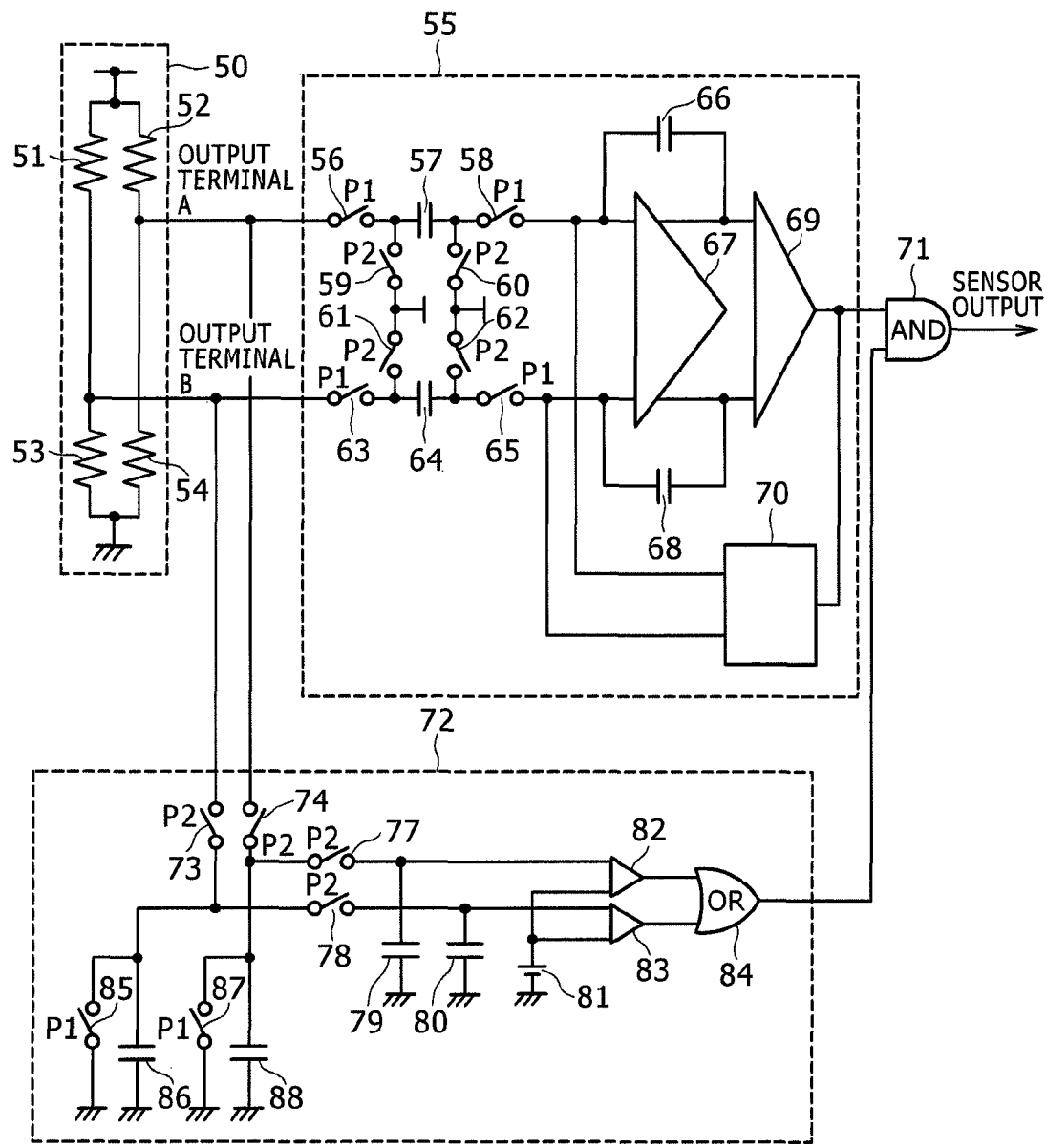
FIG. 10 is a circuit diagram of a disconnection detection circuit for a bridge circuit of a seventh embodiment.

Next, a disconnection detection circuit for a bridge circuit that is a seventh embodiment of the present invention will be described in conjunction with FIG. 10. FIG. 10 is a circuit diagram of the disconnection detection circuit for a bridge circuit of the seventh embodiment. The present embodiment is such that the constant current sources 75 and 76 of the sixth embodiment are replaced with a switched capacitor circuit composed of switches 85 and 87 and capacitors 86 and 88.

In the present embodiment, faster detection than that achieved using the constant current sources 75 and 76 is enabled by replacing the constant current sources 75 and 76 with a switched capacitor circuit. This is because the switched capacitor circuit provides less impedance than the constant current sources do. This makes it possible to speed up an operating clock for the ΔΣ modulator 55. Eventually, precision of the ΔΣ modulator 55 and responsiveness thereof can be improved.

Figure 11:
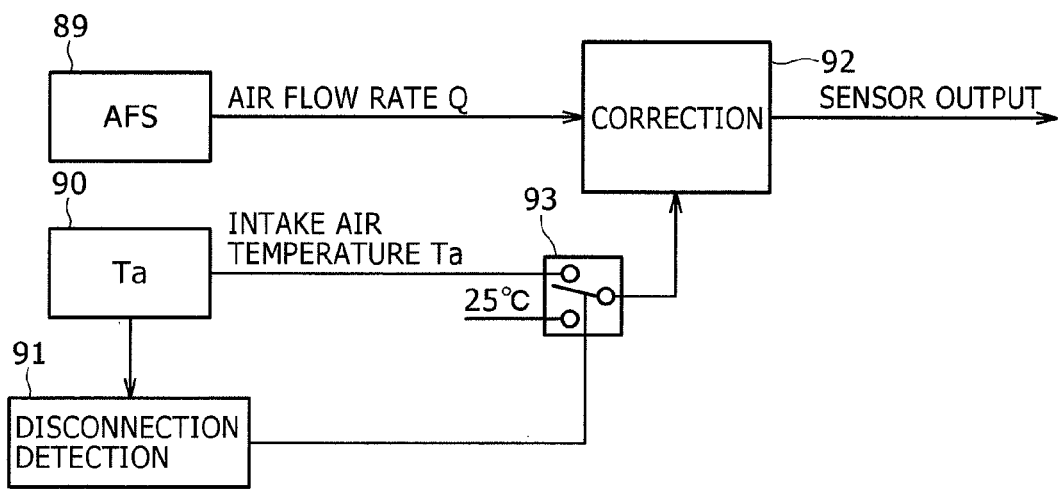
FIG. 11 is a configuration diagram of a system of an eighth embodiment including a disconnection detecting means.

Next, a system that is an eighth embodiment of the present invention and includes a disconnection detecting means will be described in conjunction with FIG. 11. FIG. 11 is a configuration diagram of the system of the eighth embodiment including the disconnection detecting means.

The present embodiment includes an airflow sensor 89 that detects an air flow rate Q, an intake air temperature sensor 90 that detects intake air temperature Ta, a disconnection detector 91 that detects the disconnection of the intake air temperature sensor 90, a correction circuit 92 that corrects the air flow rate Q, which is an output signal of the airflow sensor 89, with the intake air temperature Ta that is an output signal of the intake air temperature sensor 90, and a switching circuit 93 that, if the disconnection detector 91 detects a disconnection, fixes the signal of the intake air temperature Ta, which is handed to the correction circuit 92, to 25° C.

The present embodiment is the system in which if the intake air temperature sensor 90 is disconnected and outputs the signal having an extremely large error, the correction circuit 92 is prevented from performing excess correction processing and outputting a signal, which has an extremely large error, as a sensor output (air flow rate signal). In the present embodiment, if the intake air temperature sensor 90 is disconnected, the switching circuit 93 fixes the signal of the intake air temperature Ta, which is fed to the correction circuit 92, to 25° C. Thus, excessive correction is prevented. Accordingly, even if the intake air temperature sensor 90 is disconnected, an error in the sensor output can be suppressed. In particular, as far as an airflow sensor that measures an intake air flow rate of an automobile is concerned, if an error caused by the airflow sensor is large, a fatal phenomenon that an engine is not started takes place. In particular, such an event must be avoided that although the airflow sensor 89 does not fail, the sensor output becomes extremely abnormal because of the failure of the intake air temperature sensor 90. The present system can avoid the event.

Figure 12:
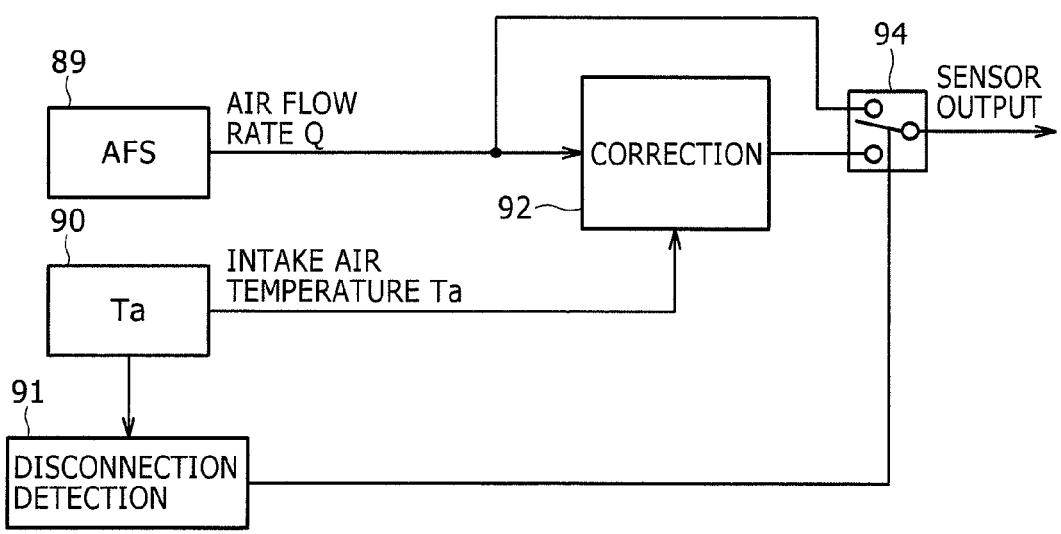
FIG. 12 is a configuration diagram of a system of a ninth embodiment including a disconnection detecting means.

Next, a system that is a ninth embodiment of the present invention and includes a disconnection detecting means will be described in conjunction with FIG. 12. FIG. 12 is a configuration diagram of the system of the ninth embodiment including the disconnection detecting means. The present embodiment is a system that includes the disconnection detecting means and has the switching circuit 93, which is included in the system of the eighth embodiment including the disconnection detecting means, changed into a switching circuit 94.

In the present embodiment, the switching circuit 93 is changed into the switching circuit 94. If the intake air temperature sensor is disconnected, the correction circuit 92 is bypassed in order to prevent excessive correction. Thus, even if the intake air temperature sensor 90 is disconnected, an error in the sensor output can be suppressed.

Figure 13:
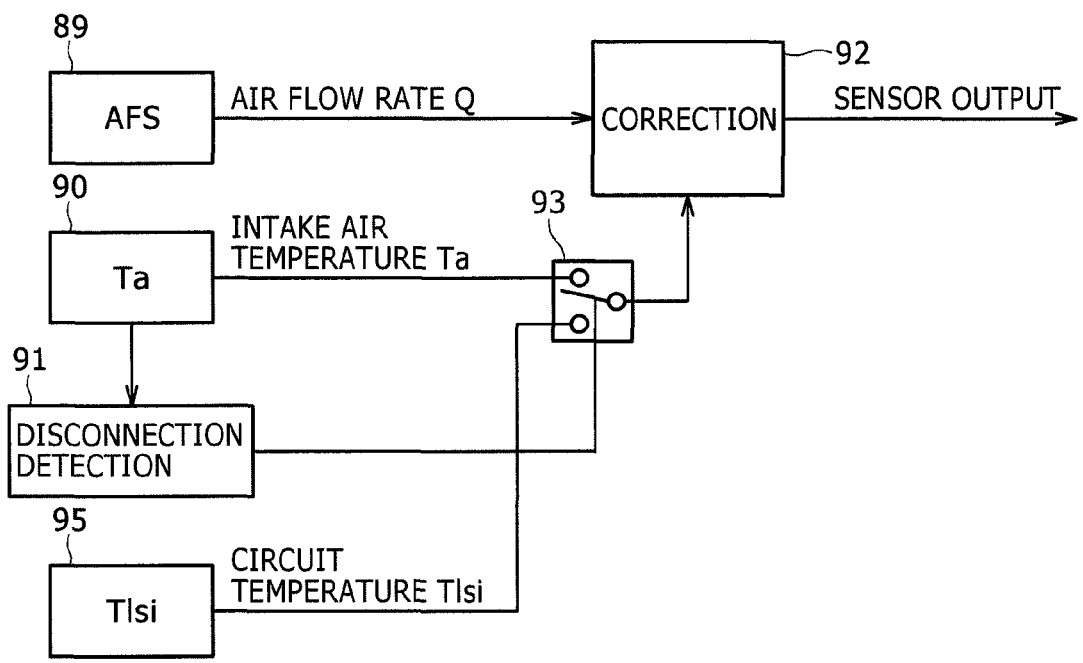
FIG. 13 is a configuration diagram of a system of a tenth embodiment including a disconnection detecting means.

Next, a system that is a tenth embodiment of the present invention and includes a disconnection detecting means will be described in conjunction with FIG. 13. FIG. 13 is a configuration diagram of the system of the tenth embodiment including the disconnection detecting means. The present embodiment is a system that includes the disconnection detecting means, has a circuit temperature sensor 95 added to the system of the eighth embodiment including the disconnection detecting means, and has a switching destination at a disconnection time by the switching circuit 93 changed to another.

In the present embodiment, the circuit temperature sensor 95 is added, and the switching destination at a disconnection time by the switching circuit 93 is changed to another. If the intake air temperature sensor is disconnected, the switching destination of the correction circuit 92 is set to the circuit temperature sensor 95 in order to prevent excessive correction. This is attributable to the fact that in a steady state, there is no large difference between the intake air temperature Ta and circuit temperature Tlsi. Accordingly, even if the intake air temperature sensor 90 is disconnected, an error in the sensor output can be suppressed.

LIST OF REFERENCE SIGNS

1, 35, 50: detection element
2, 3, 4, 5, 15, 16, 17, 18, 36, 37, 51, 52, 53, 54: sensor element resistor
6, 21, 39, 67: amplifier
7, 40, 93, 94: switching circuit
8, 8a, 8b, 8c, 41, 46: disconnection detection circuit
9, 10, 19, 20: resistor
11, 38, 43, 45, 58, 81: reference voltage source
12, 13, 44, 49, 69, 82, 83: comparator
14, 84: OR circuit
22, 42, 47, 75, 76: constant current source
23, 24, 25: transistor
26, 28, 29, 30, 31, 32, 56, 58, 59, 60, 61, 62, 63, 65, 73, 74, 77, 78, 85, 87: switch
27, 33, 34, 57, 64, 66, 68, 79, 80, 86, 88: capacitor
55: ΔΣ modulator
70: local D/A converter
71: AND circuit
72: disconnection detection circuit
89: airflow sensor
90: intake air temperature sensor
91: disconnection detector
92: correction circuit

The invention claimed is:

1. A disconnection detection circuit for a bridge circuit, comprising:
   a sensor element resistor whose resistance value varies depending on a physical quantity;
   a bridge circuit composed of a plurality of resistors including the sensor element resistor, the bridge circuit being supplied with a voltage between a power terminal and a ground terminal, wherein a power terminal voltage is higher than a ground terminal voltage;
   an output terminal through which an intermediate voltage of the bridge circuit is fetched into outside; and
   a bridge output detection circuit that detects the intermediate voltage fetched through the output terminal, the disconnection detection circuit for a bridge circuit being connected to the output terminal, wherein the disconnection detection circuit comprises:
   a conducting means that causes a current to flow into the output terminal of the bridge circuit;
   a potential difference detection means that detects a potential difference between the potential at the output terminal of the bridge circuit and a predetermined potential and detects a disconnection;
   a switching means that, when the disconnection detecting means detects a disconnection, fixes the output of the bridge output detection circuit to a supply voltage or ground voltage,
   the conducting means is connected to the output terminal, and that
   the voltage at the power terminal of the bridge circuit is a low potential with respect to the predetermined potential.

2. A disconnection detection circuit for a bridge circuit, comprising:
   a sensor element resistor whose resistance value varies depending on a physical quantity;
   a bridge circuit composed of a plurality of resistors including the sensor element resistor, the bridge circuit being supplied with a voltage between a power terminal and a ground terminal, wherein a power terminal voltage is higher than a ground terminal voltage;
   an output terminal through which an intermediate voltage of the bridge circuit is fetched into outside; and
   a bridge output detection circuit that detects the intermediate voltage fetched through the output terminal, the disconnection detection circuit for a bridge circuit being connected to the output terminal,
   wherein the disconnection detection circuit comprises:
   a conducting means that causes a current to flow into the output terminal of the bridge circuit;
   a potential difference detection means that detects a potential difference between the potential at the output terminal of the bridge circuit and a predetermined potential and detects a disconnection;
   a switching means that, when the disconnection detecting means detects a disconnection, fixes the output of the bridge output detection circuit to a supply voltage or ground voltage,
   the conducting means is connected to the output terminal, and that
   the voltage at the ground terminal of the bridge circuit is a high potential with respect to the predetermined potential.

3. The disconnection detection circuit for a bridge circuit according to claim 1 or claim 2, wherein
a selection switch is included between the output terminal and conducting means and between the output terminal and bridge output detection circuit.

4. The disconnection detection circuit for a bridge circuit according to claim 3, wherein
the selection switch performs a switching action at the timing when the bridge output detection circuit and conducting means are alternately switched.

5. The disconnection detection circuit for a bridge circuit according to claim 1 or claim 2, wherein
the conducting means is formed with a resistor.

6. The disconnection detection circuit for a bridge circuit according to claim 1 or claim 2, wherein
the bridge output detection circuit is a delta-sigma modulator.

7. The disconnection detection circuit for a bridge circuit according to claim 6, wherein
the disconnection detection circuit comprises a means that, when the disconnection detecting means detects a disconnection, fixes the output of the delta-sigma modulator to a high level or low level.

8. The disconnection detection circuit for a bridge circuit according to claim 6, wherein
the output terminal of the bridge circuit is switched to the conducting means during a non-sampling period of the delta-sigma modulator.

9. A physical quantity detection system, including:
a first sensor that outputs a signal according to a first physical quantity,
a second sensor that outputs a signal according to a second physical quantity,
a correcting means that corrects a characteristic of the first sensor according to the output of the second sensor,
the disconnection detection circuit according to claim 1 or claim 2 that detects a disconnection of the second sensor, and
a changing means that, when the disconnection detection circuit detects the disconnection, changes an action of the correcting means to another.

10. The physical quantity detection system according to claim 9, wherein
when the disconnection detecting means detects the disconnection, the changing means fixes the output signal of the second sensor to a predetermined value and inputs the value to the correcting means.

11. The physical quantity detection system according to claim 9, wherein
when the disconnection detecting means detects the disconnection, the changing means switches the output signal of the second sensor to a signal of a third sensor and inputs the signal of the third sensor to the correcting means.

12. The physical quantity detection system according to claim 9, wherein
when the disconnection detecting means detects the disconnection, the changing means ceases the action of the correcting means.

13. The physical quantity detection system according to claim 9, wherein
the first sensor is a sensor that detects an air flow rate.

14. The physical quantity detection system according to claim 9, wherein
the second sensor is a sensor that detects an air temperature.

15. The physical quantity detection system according to claim 11, wherein
the third sensor is a sensor that detects a circuit temperature of an LSI.

* * * * *